United States Patent
Melanson

(10) Patent No.: US 7,145,367 B2
(45) Date of Patent: *Dec. 5, 2006

(54) FRACTIONAL-INTEGER PHASE-LOCKED LOOP SYSTEM WITH A FRACTIONAL-FREQUENCY-INTERVAL PHASE FREQUENCY DETECTOR

(75) Inventor: John L. Melanson, Austin, TX (US)

(73) Assignee: Cirrus Logic, Inc., Austin, TX (US)

( * ) Notice: Subject to any disclaimer, the term of this patent is extended or adjusted under 35 U.S.C. 154(b) by 0 days.

This patent is subject to a terminal disclaimer.

(21) Appl. No.: 11/331,638

(22) Filed: Jan. 13, 2006

(65) Prior Publication Data

US 2006/0114031 A1    Jun. 1, 2006

Related U.S. Application Data

(63) Continuation of application No. 10/770,186, filed on Feb. 2, 2004, now Pat. No. 7,049,852.

(51) Int. Cl.
*H03K 21/00*    (2006.01)

(52) U.S. Cl. ............................................. 327/5; 327/47

(58) Field of Classification Search ............... None
See application file for complete search history.

(56) References Cited

U.S. PATENT DOCUMENTS

| 5,917,352 A | 6/1999 | Dunlap et al. |
| 6,288,574 B1 | 9/2001 | Neary |
| 6,952,138 B1 * | 10/2005 | Hagberg et al. ............ 327/158 |

OTHER PUBLICATIONS

Galton, I., "Fractional-N phase locked loops for frequeny synthesis," Silicon Labs Distinguished Seminar on Mixed Signal Design, Univ. of Texas at Austin, Mar. 25, 2003.
Galton, I., "Delta-Sigma fractional-N phase-locked loops," from Phase-Locking in High Performance Systems: From Devices to Architecture, Behzad Razavi, Wilsy-IEEE Press, Feb. 2003, p. 23-33.
Pamarti et al., "A wideband 2.4 GHz delta-sigma franctional-N PLL with a Mb/s in-loop modulation," IEEE J. Solid-State Cir., 39(1):49-62, Jan. 2004.

* cited by examiner

*Primary Examiner*—Timothy P. Callahan
*Assistant Examiner*—Cassandra Cox
(74) *Attorney, Agent, or Firm*—Steven Lin, Esq.

(57) ABSTRACT

A phase-locked loop circuit has a fractional-frequency-interval phase frequency detector, a charge pump, an oscillator, and a divider. The fractional-frequency-interval phase frequency detector has a phase frequency detector unit that is utilized as or comprises a plurality of phase frequency detector units. The divider is responsive to the oscillator and provides divider values for dividing an oscillator frequency by the divider values to provide a feedback frequency of a feedback loop signal of the phase-locked loop circuit. A reference input frequency is input as a first input into the phase frequency detector unit. The feedback frequency is input and selectively delayed as second inputs into the phase frequency detector unit so that the second inputs are aligned for input according to the reference input frequency and an oscillator frequency is, in effect, responsive to the phase frequency detector units and allowed to be divided by a fractional-integer divider value.

19 Claims, 5 Drawing Sheets

FIGURE 1 - PRIOR ART

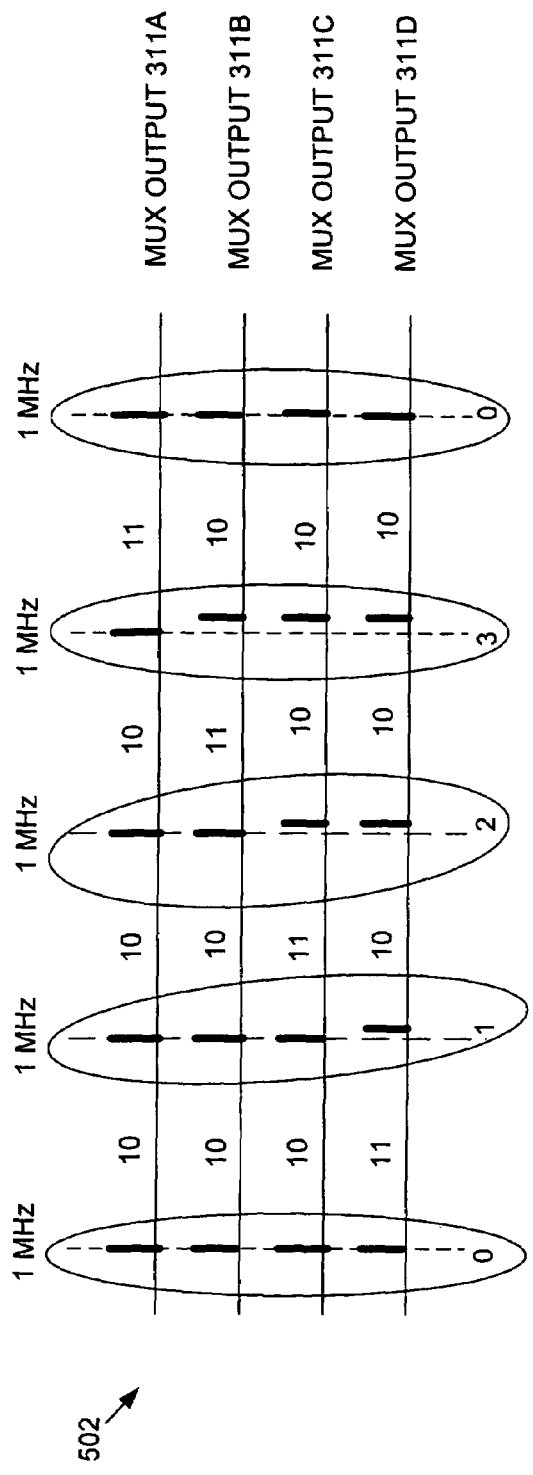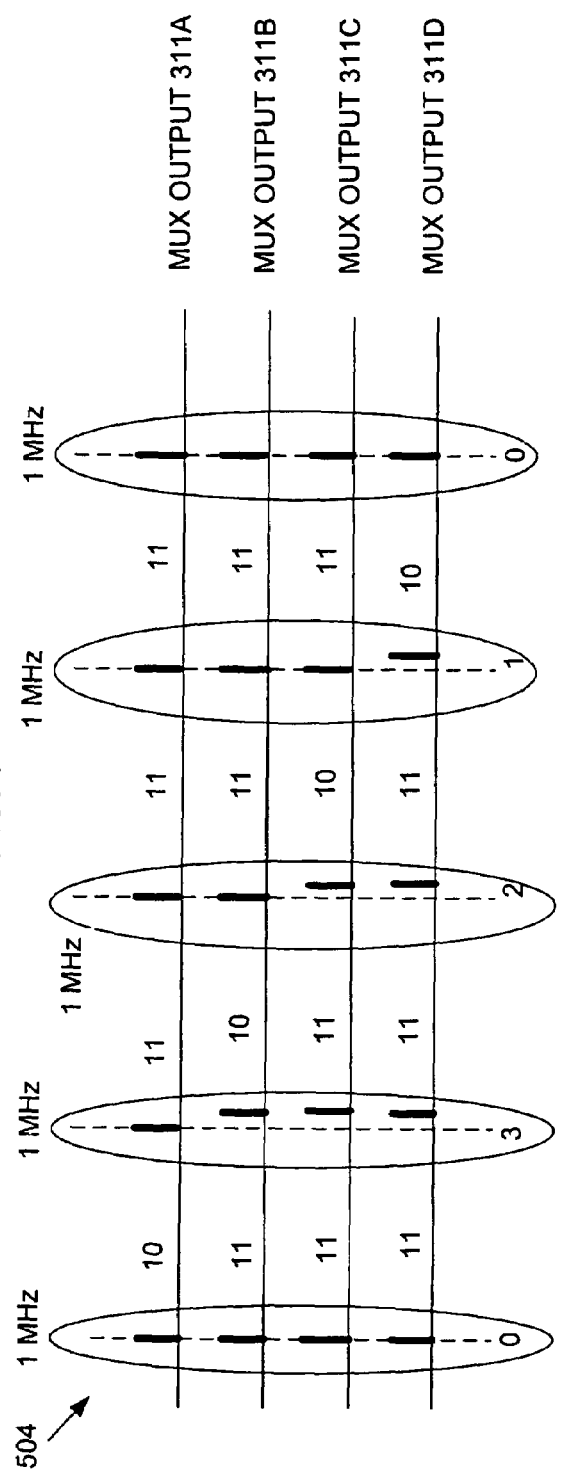
FIGURE 5A
FIGURE 5B

FRACTIONAL-INTEGER PHASE-LOCKED LOOP SYSTEM WITH A FRACTIONAL-FREQUENCY-INTERVAL PHASE FREQUENCY DETECTOR

This application is a Continuation of application Ser. No. 10/770,186 filed on Feb. 2, 2004, which is now U.S. Pat. No. 7,049,852.

BACKGROUND OF THE INVENTION

1. Field of the Invention

The present invention relates to phase-locked loop ("PLL") circuits, and, more particularly, to a fractional-integer PLL circuit. More specifically, the present invention relates to a fractional-integer PLL circuit having a fractional-frequency-interval phase frequency detector.

2. Description of Related Art

A phase-locked loop ("PLL") circuit generally includes a phase detector, a loop filter, and a controlled oscillator. The phase detector receives an input signal, which has a reference frequency. The output signal of the controlled oscillator is fed back to the phase detector. The frequency of the output signal is typically a multiple of the reference frequency of the input signal. The PLL circuit is utilized to lock the output frequency to the input frequency. Locking the output frequency to the input reference frequency is critical in various applications, such as developing accurate and precise clocks for digital signal processors ("DSPs") and for audio sampling frequencies and rates. Fast locking applications also exist in which adaptive bandwidth PLLs have been developed and used.

However, certain applications in the electronics field require the use of fractional multiples instead of integer multiples of a reference clock frequency. Fractional-N phase locked loops (PLLs) have been developed and utilized to provide fractional multiples of a reference frequency for such applications. One way of providing a fractional-N PLL is to dynamically switch the divider module of the PLL between two integer values to provide the desired fractional integer. However, dynamic switching of the divider module between two integer values increases the phase noise that is introduced into the PLL. For example, for each reference period, a difference between the actual divider module value and an average ideal value represents an error that is injected into the PLL, which results in increased phase noise.

A delta-sigma fractional-N PLL wherein fractional-N is a fractional integer overcomes at least the white noise problem by having a digital delta-sigma modulator provide a sequence for the divider module such that the quantization noise is in a frequency band well above a desired bandwidth of the PLL. A delta-sigma fractional-N PLL is similar to an integer-N PLL, but the delta-sigma fractional-N PLL has additional digital circuitry for interpolating between integer multiples of the reference frequency.

FIG. 1 shows a block diagram of an exemplary delta-sigma fractional-N phase-locked loop (PLL) circuit 100 according to the prior art. Loop filter 100 includes a phase frequency detector 104, a charge pump 106, a loop filter 108, and a voltage-controlled oscillator (VCO) 110 coupled together in series as shown in FIG. 1. Input reference clock signal 103 is fed into a positive input node of phase frequency detector 104.

An N divider 112 is coupled in the feedback loop of delta-sigma fractional-N PLL circuit 100. The feedback loop consists of an output signal 116 of PLL circuit 100 fed into an N divider 112 as shown in FIG. 1. N divider 112, in effect, divides output signal 116 by a factor of N to provide an input feedback signal 113. The N-divided input feedback signal 113 is fed back as an input signal into the negative input node of phase frequency detector 104. Input feedback signal 113 is also fed into digital delta-sigma modulator 114. Delta-sigma modulator 114 allows output signal 116 to be divided by a divider value between integer multiple values of N and another integer (e.g., N−1 and/or N+1) based on the ratio input 111 received. Ratio input 111 is utilized to define a fractional value for the desired fractional-integer. Modulated output signal 115 from digital delta-sigma modulator 114 is fed into N divider 112. Digital delta-sigma modulator 114 allows output signal 116 to be divided by a divider value that is just between integer values (e.g., the integer value N and another integer value N−1 and/or N+1) to provide the desired fractional value. Digital delta-sigma modulator 114 also provides the sequence for N divider 112 such that the quantization noise is in a frequency band well above a desired bandwidth of PLL circuit 100.

The present invention recognizes the desire and need for providing a fractional-integer PLL circuit having a wider bandwidth and a higher, more desired corner frequency. The present invention further recognizes the desire and need to provide a fractional-integer PLL that reduces or eliminates non-linear errors that tend to cause out-of-band modulator quantization noise to be folded into low frequencies. The present invention also recognizes the need and desire for a fractional-integer PLL that minimizes or avoids the introduction of additional noise and errors. The present invention additionally recognizes the need and desire for a fractional-integer PLL that is not limited to just modulating between integer divider values. The present invention overcomes the problems and disadvantages in accordance with the prior art.

SUMMARY OF THE INVENTION

A phase-locked loop circuit has a fractional-frequency-interval phase frequency detector, a charge pump, an oscillator, and a divider. The fractional-frequency-interval phase frequency detector has a phase frequency detector unit that is utilized as or comprises a plurality of phase frequency detector units. The divider is responsive to the oscillator and provides divider values for dividing an oscillator frequency by the divider values to provide a feedback frequency of a feedback loop signal of the phase-locked loop circuit. A reference input frequency is input as a first input into the phase frequency detector unit. The feedback frequency is input and selectively delayed as second inputs into the phase frequency detector unit so that the second inputs are aligned for input according to the reference input frequency and an oscillator frequency is, in effect, responsive to the phase frequency detector units and allowed to be divided by a fractional-integer divider value.

BRIEF DESCRIPTION OF THE DRAWINGS

The novel features believed characteristic of the invention are set forth in the appended claims. The invention itself, however, as well as a preferred mode of use, further objects and advantages thereof, will best be understood by reference to the following detailed description of an illustrative embodiment when read in conjunction with the accompanying drawings, wherein:

FIG. 5A is an exemplary output timing diagram for the multiplexer of the fractional-frequency-interval phase frequency detector of FIG. 3 for one desired fractional-integer divider value based on the desired divide ratio; and FIG. 5B is another exemplary output timing diagram for the multiplexer of the fractional-frequency-interval phase frequency detector of FIG. 3 for another desired fractional-integer divider value based on another desired divide ratio.

DETAILED DESCRIPTION OF THE INVENTION

A fractional-frequency-interval phase frequency detector for a phase locked loop ("PLL") circuit is disclosed.

It is well known in the art that signals for a PLL circuit can be either voltage signals or current signals. Conversion between the voltage and current domains can be performed. Therefore, a PLL circuit could be described as a system having either a respective voltage or current mode filter and either a respective voltage or current controlled oscillator.

Figure 1:
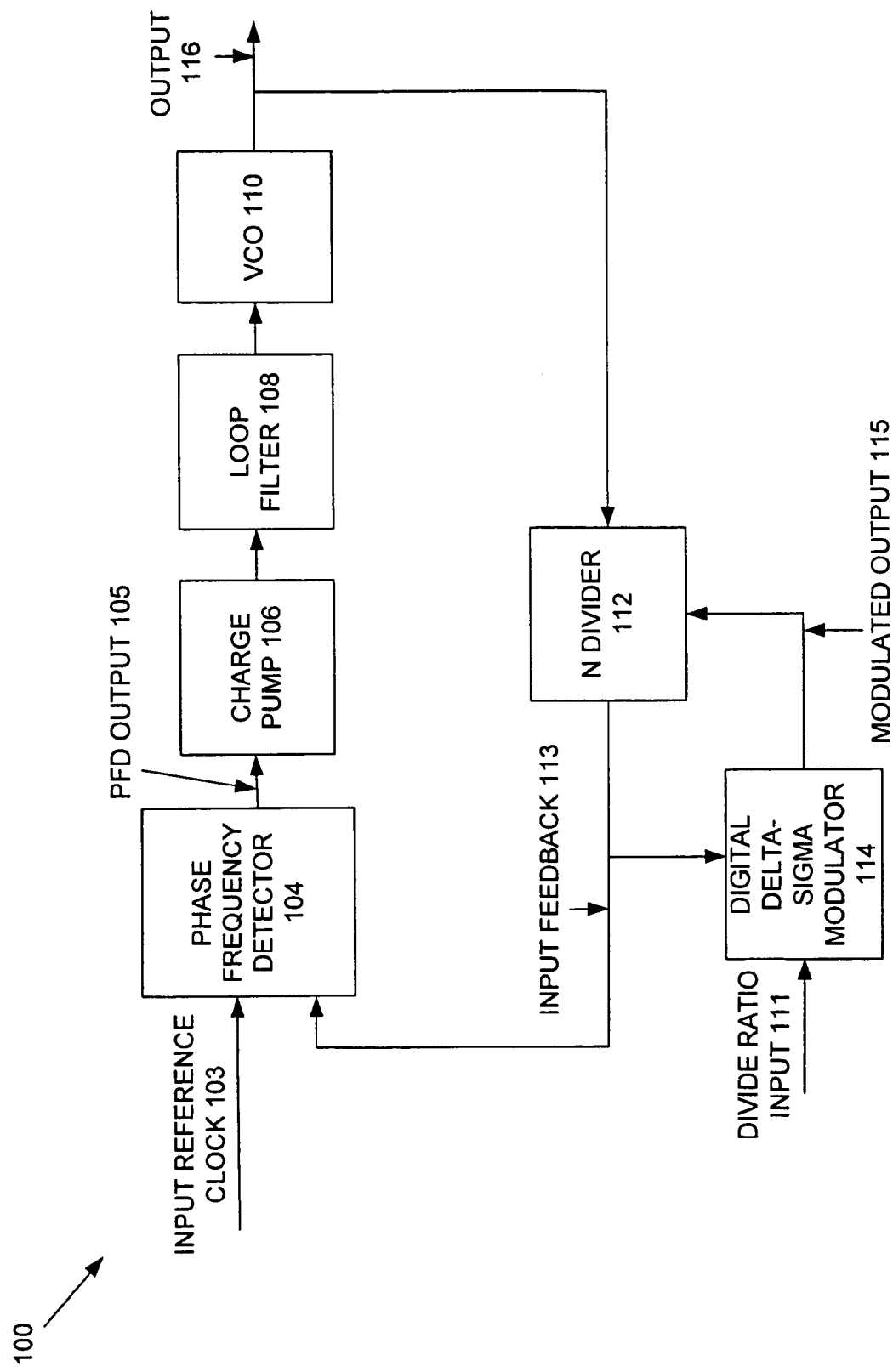
FIG. 1 is a block diagram of an exemplary delta-sigma fractional-N phase-locked loop (PLL) circuit according to the prior art.
Figure 2:
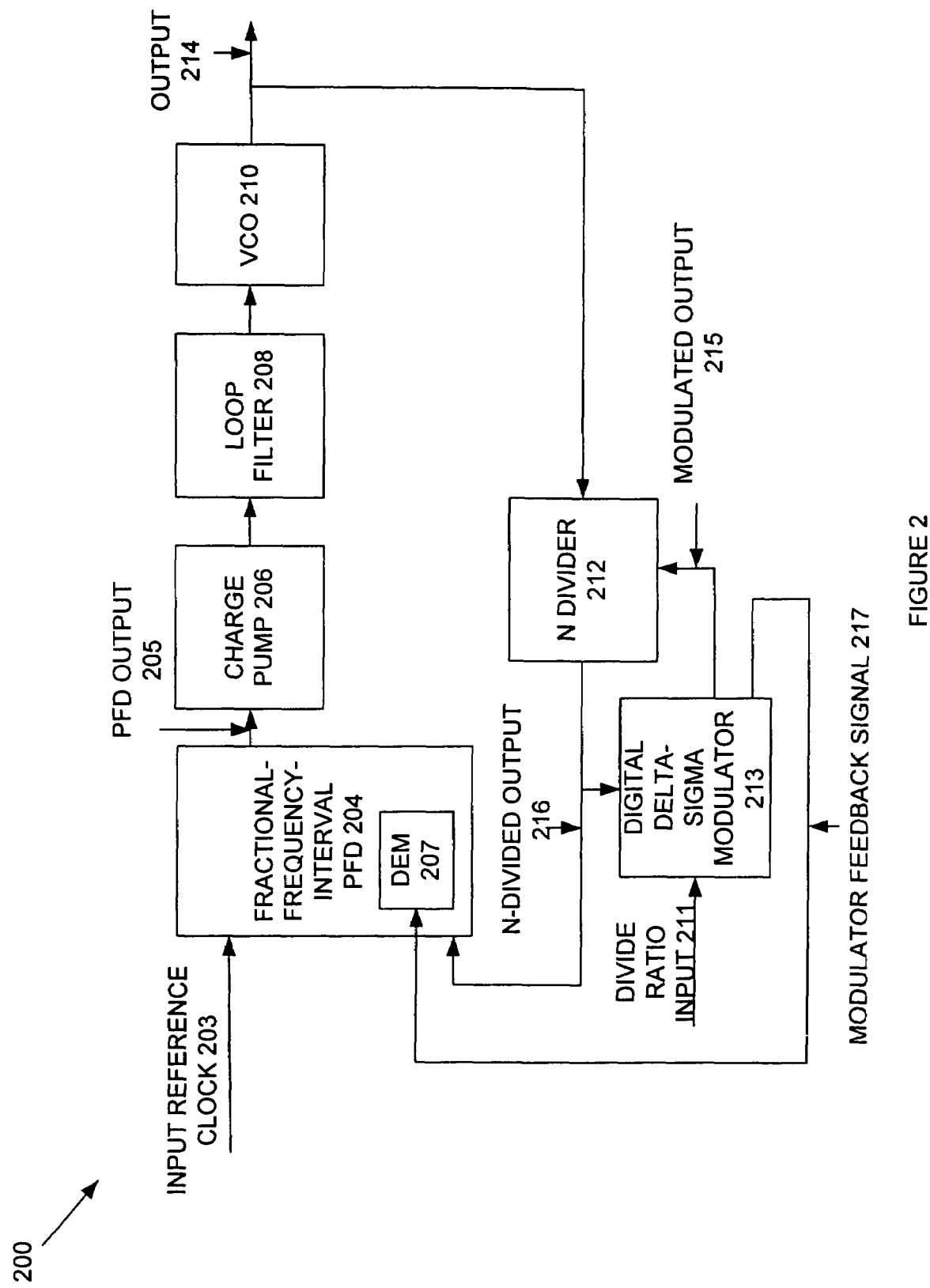
FIG. 2 is a block diagram of an exemplary delta-sigma fractional-integer PLL circuit having a fractional-frequency-interval phase frequency detector according to the present invention.

With reference now to FIG. 2, an exemplary delta-sigma fractional-integer phase-locked loop ("PLL") circuit 200 according to the present invention is shown. Fractional-integer PLL circuit 200 includes a fractional-frequency-interval phase frequency detector ("PFD") 204, a charge pump 206, a loop filter system 208, and a voltage controlled oscillator ("VCO") 210 coupled together in series as shown in FIG. 2. An input reference clock signal 203 is fed into an input node of fractional-frequency-interval PFD 204. An N divider 212 is coupled in a feedback loop of fractional-integer PLL circuit 200. The feedback loop consists of an output signal 214 of fractional-integer PLL circuit 200 fed into an N divider 212 as shown in FIG. 2. N divider 212 is responsive to VCO 210 and provides divider values for dividing an oscillator frequency of VCO 210 by the divider values to provide a feedback frequency of N-divided output signal 216, which is a feedback loop signal fed back into another node of fractional-frequency-interval PFD 204. Fractional-frequency-interval PFD 204 has a dynamic-element-matching ("DEM") system 207, and fractional-frequency-interval PFD 204 provides a phase frequency detector ("PFD") output signal 205.

N-divided output signal 216 from N divider 212 is also fed into a digital delta-sigma modulator 213. Digital delta-sigma modulator 213 receives a desired divide ratio 211. Digital delta-sigma modulator 213 is coupled to N divider 212 to receive and clock the feedback frequency of N-divided output signal 216. Digital delta-sigma modulator 213 provides a modulated output signal 215 to N divider 212 for controlling the desired divide ratio input 211 for N-divided output signal 216 and for modulating between dividing the oscillator frequency of VCO 210 by the divider values based on the desired divide ratio input 211. For example, the divider values may be two or three integer values (e.g., N−1, N, or N+1). Furthermore, digital delta-sigma modulator 213 provides a modulator feedback signal 217 to fractional-frequency-interval PFD 204. Digital delta-sigma modulator 213, in effect, determines a divider value for each of the plurality of phase frequency detector units by determining and providing a select number among the plurality of phase frequency detector units that are to receive a delayed feedback frequency.

Digital delta-sigma modulator 213 also provides a modulator feedback signal 217 to DEM system 207. Modulator feedback signal 217 provides the information relating to the divider values and as to how many of the phase frequency detector ("PFD") unit(s) 304A, 304B, 304C, . . . , 304X (e.g., see FIG. 3) in fractional-frequency-interval PFD 204 is/are to receive a delayed feedback frequency (e.g., a delayed N-divided output signal 216). DEM system 207 determines which of the PFD unit(s) 304A, 304B, 304C, . . . , 304X is/are to receive the delayed feedback frequency. DEM system 207 dynamically matches usage of PFD units 304A, 304B, 304C, . . . , 304X over a time period. DEM system 207 reduces or eliminates mismatches that exist among PFD units 304A, 304B, 304C, . . . , 304X. The delayed feedback frequency to the selected PFD units 304A, 304B, 304C, . . . , 304X help align the second inputs to the PFD units 304A, 304B, 304C, . . . , 304X with the reference frequency. The delayed feedback frequency to the selected PFD units 304A, 304B, 304C, . . . , 304X also allows the oscillator frequency of VCO 210 to, in effect, be divided by divider values that are between integers (e.g., fractional-integers) instead of just between integers.

Figure 3:
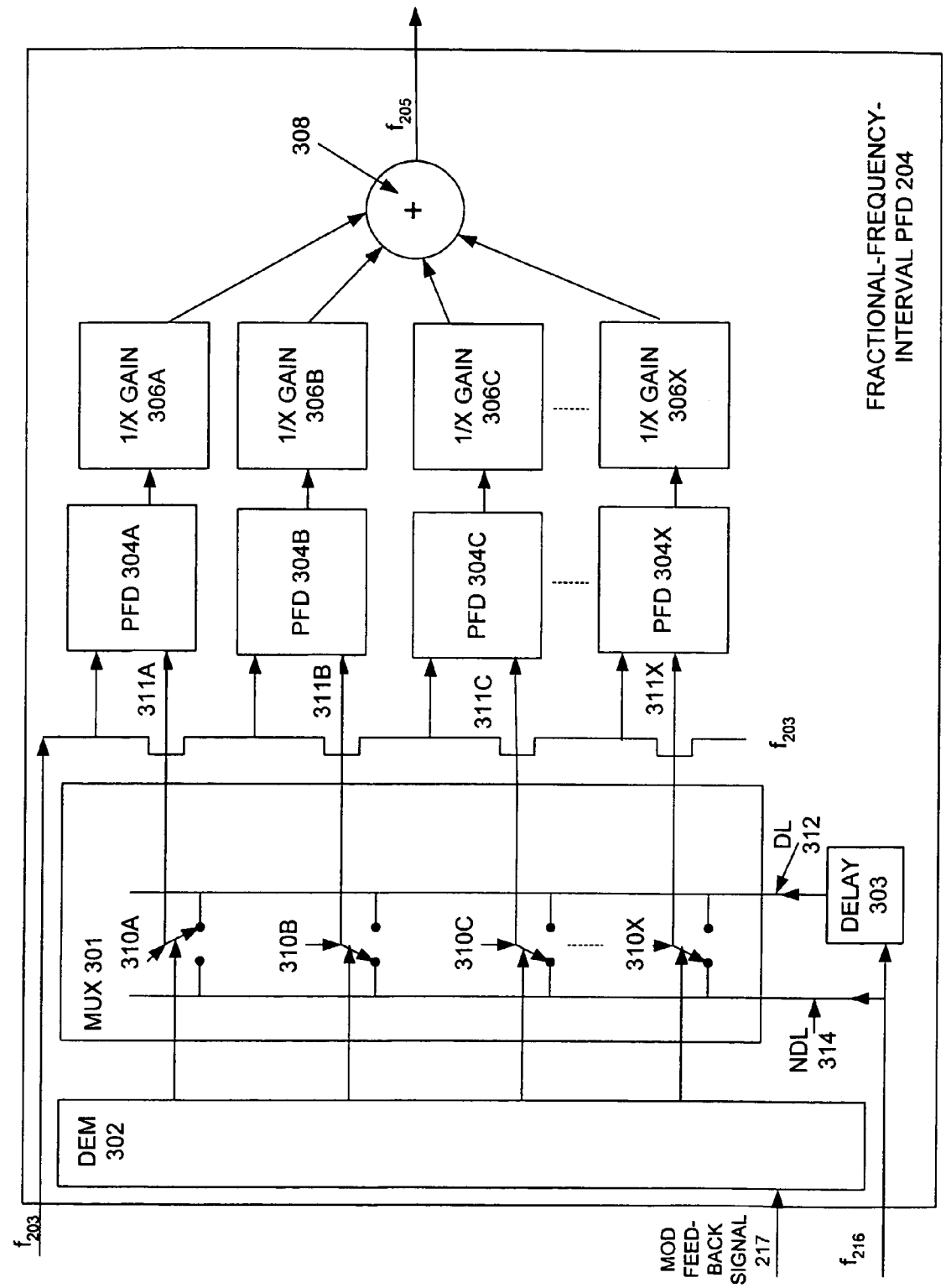
FIG. 3 is a detailed block diagram of an exemplary fractional-frequency-interval phase frequency detector in FIG. 2 according to the present invention.

Referring now to FIG. 3, exemplary fractional-frequency-interval PFD 204 of FIG. 2 is shown in more detail. Fractional-frequency-interval PFD 204 has an X number of phase frequency detector ("PFD") units 304A, 304B, 304C, . . . , 304X and a respective X number of 1/X gain units 306A, 306B, 306C, . . . , 306X which each has a gain of 1/X. X is an integer greater than one. PFD units 304A, 304B, 304C, . . . , 304X are coupled to respective 1/X gain units 306A, 306B, 306C, . . . , 306X as shown in FIG. 3. Reference frequency $f_{203}$ is inputted as a first input into each of the PFD units 304A, 304B, 304C, . . . , 304X, and a non-delayed feedback frequency $f_{216}$ or a delayed feedback frequency $f_{216}$ is selectively inputted as a second input into each of the PFD units 304A, 304B, 304C, . . . , 304X depending upon the fractional-integer divider value that is desired.

Fractional-frequency-interval PFD 204 also has a dynamic element matching ("DEM") system 302 and a multiplexer ("MUX") 301 coupled together as shown in FIG. 3. MUX 301 receives feedback frequency $f_{216}$. MUX 301 has a delay element 303, a delay line ("DL") 312, a non-delay line ("NDL") 314, and a number of switches 310A, 310B, 310C, . . . , 310X. DL 312 is coupled to delay element 303. Delay element 303 delays feedback frequency $f_{216}$ to provide a delayed feedback frequency $f_{216}$ through DL 312. NDL 314 simply passes through a non-delayed feedback frequency $f_{216}$. Switches 310A, 310B, 310C, . . . , 310X are each able to independently couple to either DL 312 or NDL 314 as shown in FIG. 3. Switches 310A, 310B, 310C, . . . , 310X are coupled to respective MUX outputs 311A, 311B, 311C, . . . , 311X. Second inputs of PFD units 304A, 304B, 304C, . . . , 304X receive as their inputs corresponding MUX outputs 311A, 311B, 311C, . . . , 311X.

Fractional-frequency-interval PFD 204 receive modulator feedback signal 217 from digital delta-sigma modulator 213.

Modulator feedback signal 217 from digital delta-sigma modulator 213 provides fractional-frequency-interval PFD 204 with the information, in effect, relating to a divider value for each of the PFD units 304A, 304B, 304C, . . . , 304X by determining and providing a select number among PFD units 304A, 304B, 304C, . . . , 304X that are to receive a delayed feedback frequency $f_{216}$.

DEM 302 determines which of PFD units feedback frequency $f_{216}$ is/are to receive delayed feedback frequency $f_{216}$. DEM 302 dynamically matches element usage of PFD units 304A, 304B, 304C, . . . , 304X for receiving the delayed feedback frequency $f_{216}$ over a time period. Ideally, PFD units 304A, 304B, 304C, . . . , 304X are identical to each other. However, typically, element mismatches exist among each of PFD units 304A, 304B, 304C, . . . , 304X since each PFD unit is not exactly identical to each other. DEM 302 dynamically matches usage of PFD units 304A, 304B, 304C, . . . , 304X over a time period to reduce or eliminate errors due to element mismatches among PFD units 304A, 304B, 304C, . . . , 304X. Based on the information received from modulator feedback signal 217, DEM system 302 controls switches 310A, 310B, 310C, . . . , 310X to select which of PFD units 304A, 304B, 304C, . . . , 304X receive through DL 312 delayed feedback frequency $f_{216}$ as a second input and which other ones receive through NDL 314 a non-delayed feedback frequency $f_{216}$ as a second input.

For example, FIG. 3 shows DEM 302 controlling MUX 301 so that MUX output 311A provides a delayed feedback frequency $f_{216}$ as a second input to PFD unit 304A since switch 310A is coupled to DL 312. FIG. 3 further shows DEM 302 controlling MUX 301 so that MUX outputs 311B, 311C, and 311X each provide a non-delayed feedback frequency $f_{216}$ as a second input to PFD units 304B, 304C, and 304X since switches 310B, 310C, and 310X are coupled to NDL 314.

Fractional-frequency-interval PFD 204 also has a summer 308 which receives and sums outputs from the PFD units 304A, 304B, 304C, . . . , 304X. The summed outputs contribute to or provide a summed output frequency $f_{205}$ that is representative of a comparison result between the reference frequency and the fractional-integer feedback frequency. Frequency $f_{205}$ is the frequency of PFD output signal 205. As stated earlier, the delayed feedback frequency $f_{216}$ to the selected PFD units 304A, 304B, 304C, . . . , 304X help align the second inputs to the PFD units 304A, 304B, 304C, . . . , 304X with the reference frequency $f_{203}$. The delayed feedback frequency $f_{216}$ to the selected PFD units 304A, 304B, 304C, . . . , 304X also allows the oscillator frequency of VCO 210 to, in effect, be divided by divider values that are between integers (e.g., fractional-integers) instead of just between integers.

Although FIG. 3 illustrates one implementation of fractional-frequency interval PFD 204 utilizing a plurality of PFD units 304A, 304B, 304C, . . . , 304X, another implementation of the present invention involves using only one PFD unit in which hardware of the one PFD unit is shared and utilized to provide the operations of a plurality of PFD units 304A, 304B, 304C, . . . , 304X. The one PFD unit would receive a single reference frequency $f_{203}$ and respective multiple delayed or non-delayed feedback frequencies $f_{216}$.

Figure 4A:
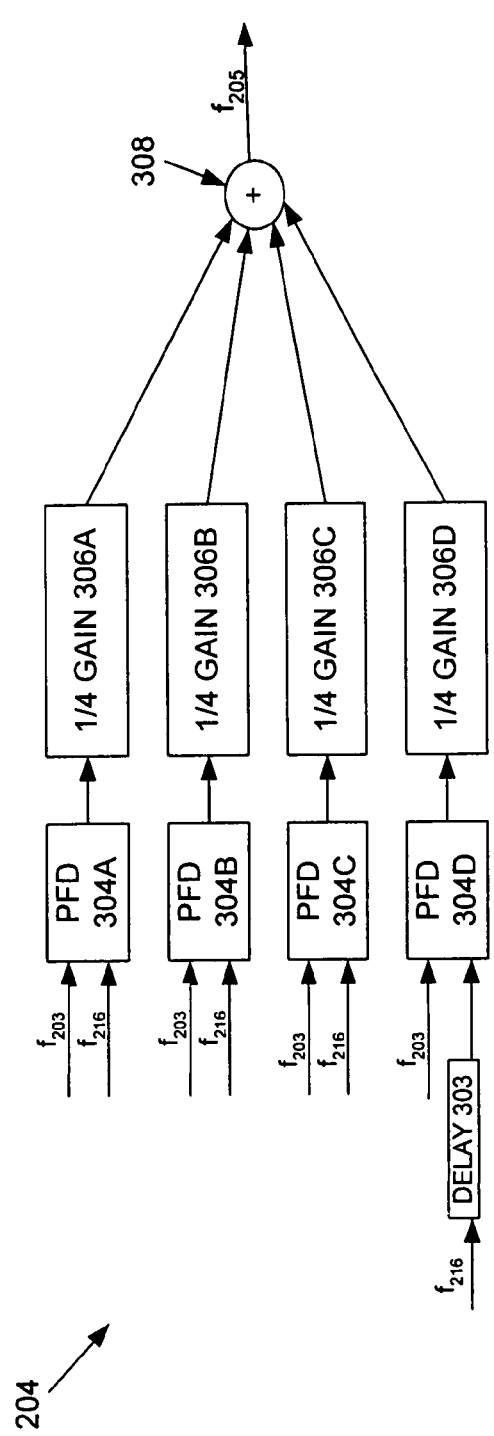
FIG. 4A is a high-level diagram illustrating one instance of exemplary inputs to the phase frequency detector units of the fractional-frequency-interval phase frequency detector of FIG. 2.

With reference now to FIG. 4A, a high-level diagram illustrating one instance of exemplary inputs to PFD units of fractional-frequency-interval PFD 204 is shown. In this example, X equals four (4), and fractional-frequency-interval PFD 204 has four (4) PFD units 304A, 304B, 304C, 304D. Four (4) respective ¼ gain units 306A, 306B, 306C, and 306D, which each provide a gain of ¼, are coupled to PFD units 304A, 304B, 304C, and 304D. In this one instance of exemplary inputs, reference frequency $f_{203}$ is fed as a first input to each of the four PFD units 304A, 304B, 304C, and 304D. The first three PFD units 304A, 304B, 304C each receives as a second input the non-delayed feedback frequency $f_{216}$ while the fourth PFD unit 304D receives as its second input the delayed feedback frequency $f_{216}$ through delay element 303. Summer 308 receives and sums outputs of ¼ gain units 306A, 306B, 306C, and 306D and provides summed output frequency $f_{205}$.

Figure 4B:
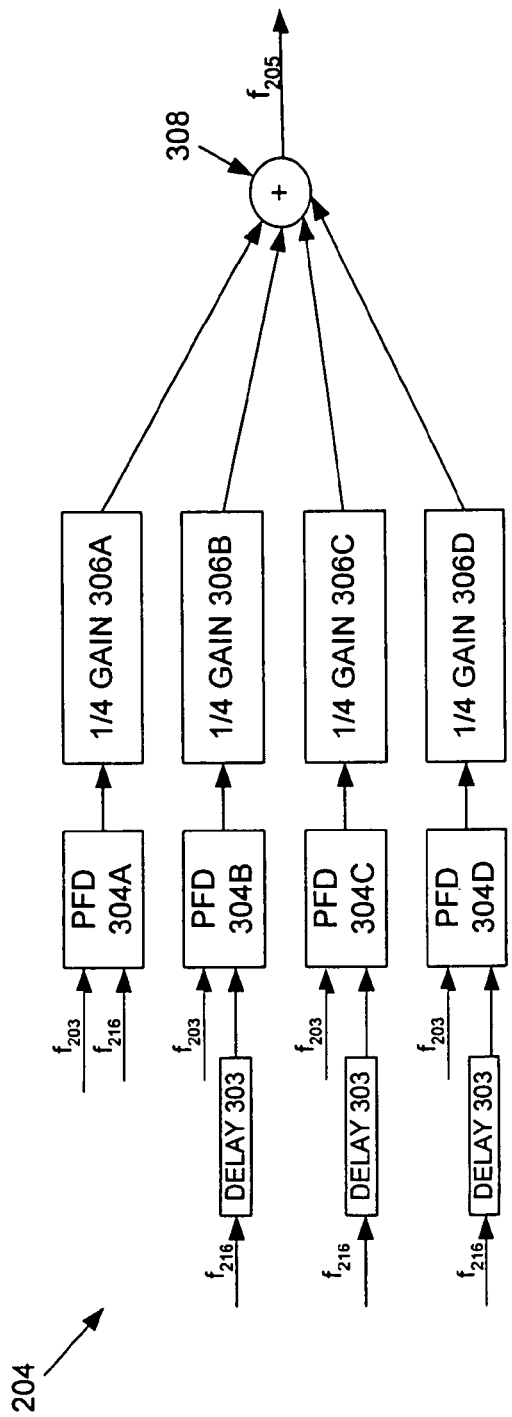
FIG. 4B is a high-level diagram illustrating another instance of exemplary inputs to the phase frequency detector units of the fractional-frequency-interval phase frequency detector of FIG. 2.

With reference now to FIG. 4B, a high-level diagram illustrating another instance of exemplary inputs to PFD units of fractional-frequency-interval PFD 204 is shown. In this example, X again equals four (4), and fractional-frequency-interval PFD 204 has four (4) PFD units 304A, 304B, 304C, 304D. Four (4) respective ¼ gain units 306A, 306B, 306C, and 306D, which each provide a gain of ¼, are coupled to PFD units 304A, 304B, 304C, and 304D. In this other instance of exemplary inputs, reference frequency $f_{203}$ is fed as a first input to each of the four PFD units 304A, 304B, 304C, and 304D. The first PFD unit 304A receives as a second input the non-delayed feedback frequency $f_{216}$ while the second, third, and fourth PFD units 304B, 304C, and 304D receives as their second input the delayed feedback frequency $f_{216}$ through delay element 303. Summer 308 receives and sums outputs of ¼ gain units 306A, 306B, 306C, and 306D and provides summed output frequency $f_{205}$.

Referring now to FIG. 5A, an exemplary output timing diagram 502 for MUX 301 of fractional-frequency-interval PFD 204 is shown. In this example, the desired fractional-integer divider value is 10.25 in which the desired divide ratio is ¼ or 0.25. MUX outputs 311A, 311B, 311C, and 311D as shown in FIG. 5A are needed to, in effect, allow the oscillator frequency of VCO 210 to be divided by the desired fractional-integer divider value of 10.25. MUX outputs 311A, 311B, 311C, and 311D are fed as the respective second inputs of PFD units 304A, 304B, 304C, and 304D (see also FIG. 3). Output timing diagram 502 shows what the timing of the MUX outputs 311A, 311B, 311C, and 311D for first, second, third, fourth, and fifth instances of time according to the reference frequency 1 MHz need to be in order to allow the oscillator frequency of VCO 210 to, in effect, be divided by the desired fractional-integer divider value of 10.25. As indicated before, DEM system 302 controls, selects, and element-matches which ones, if any, of the PFD units 304A, 304B, 304C, and 304D is/are to receive the delayed feedback frequency.

MUX output signal 311A shows the dividing of the oscillator frequency of VCO 210 by a divider value of 10 for the first, second, and third instances of time according to the reference frequency of 1 MHz and the dividing of the oscillator frequency of VCO 210 by a divider value of 11 for the fourth instance of time according to the reference frequency of 1 MHz. MUX output signal 311B shows the dividing of the oscillator frequency of VCO 210 by a divider value of 10 for the first, second, and fourth instances of time according to the reference frequency of 1 MHz and the dividing of the oscillator frequency of VCO 210 by a divider value of 11 for the third instance of time according to the reference frequency of 1 MHz. MUX output signal 311C shows the dividing of the oscillator frequency of VCO 210 by a divider value of 10 for the first, third, and fourth instances of time according to the reference frequency of 1 MHz and the dividing of the oscillator frequency of VCO 210 by a divider value of 11 for the second instance of time according to the reference frequency of 1 MHz. MUX output signal 311D shows the dividing of the oscillator frequency of VCO 210 by a divider value of 10 for the second, third, and fourth instances of time according to the reference frequency of 1 MHz and the dividing of the oscillator frequency of VCO 210 by a divider value of 11 for the first instance of time according to the reference frequency of 1 MHz.

The circled information for each of the various instances is provided through modulator feedback signal 217 from digital delta-sigma modulator 213 to fractional-frequency-interval PFD 204. For example, the circled information for the first instance indicates to fractional-frequency-interval PFD 204 through modulator feedback signal 217 that none of the PFD units 304A, 304B, 304C, or 304D needs to receive a delayed feedback frequency $f_{216}$. The circled information for the second instance indicates to fractional-frequency-interval PFD 204 through modulator feedback signal 217 that one of the PFD units 304A, 304B, 304C, or 304D needs to receive the delayed feedback frequency $f_{216}$. The circled information for the third instance indicates to fractional-frequency-interval PFD 204 through modulator feedback signal 217 that two of the PFD units 304A, 304B, 304C, or 304D need to receive the delayed feedback frequency $f_{216}$. The circled information for the fourth instance indicates through modulator feedback signal 217 that three of the PFD units 304A, 304B, 304C, or 304D need to receive the delayed feedback frequency $f_{216}$. The circled information for the fifth instance indicates through modulator feedback signal 217 that none of the PFD units 304A, 304B, 304C, or 304D need to receive the delayed feedback frequency $f_{216}$.

Fractional-frequency-interval PFD 204 responds in accordance to the circled information received from digital delta-sigma modulator 213. For example, the high-level diagram of FIG. 4A, which illustrates the one instance of exemplary inputs to the PFD units in which one delayed feedback frequency $f_{216}$ is input to one of the PFD units, corresponds to the second instance of the output timing diagram 502. As a further example, the high-level diagram of FIG. 4B, which illustrates the one instance of exemplary inputs to the PFD units in which a delayed feedback frequency $f_{216}$ is input to three of the PFD units, corresponds to the fourth instance of the output timing diagram 502.

Referring now to FIG. 5B, another output timing diagram 504 for MUX 301 of fractional-frequency-interval PFD 204 is shown. In this other example, the desired fractional-integer divider value is 10.75 in which the desired divide ratio is ¾ or 0.75. MUX outputs 311A, 311B, 311C, and 311D according to FIG. 5B are needed to, in effect, allow the oscillator frequency of VCO 210 to be divided by the desired fractional-integer divider value of 10.75. MUX outputs 311A, 311B, 311C, and 311D are fed as the respective second inputs of PFD units 304A, 304B, 304C, and 304D (see also FIG. 3). Output timing diagram 504 shows what the timing of the MUX outputs 311A, 311B, 311C, and 311D for first, second, third, fourth, and fifth instances of time according to the reference frequency 1 MHz need to be in order to allow the oscillator frequency of VCO 210 to, in effect, be divided by the desired fractional-integer divider value of 10.75. As indicated before, DEM system 302 controls selects, and element-matches which ones, if any, of the PFD units 304A, 304B, 304C, and 304D is/are to receive the delayed feedback frequency.

MUX output signal 311A shows the dividing of the oscillator frequency of VCO 210 by a divider value of 10 for the first instance of time according to the reference frequency of 1 MHz and the dividing of the oscillator frequency of VCO 210 by a divider value of 11 for the second, third fourth instances of time according to the reference frequency of 1 MHz. MUX output signal 311B shows the dividing of the oscillator frequency of VCO 210 by a divider value of 10 for the second instance of time according to the reference frequency of 1 MHz and the dividing of the oscillator frequency of VCO 210 by a divider value of 11 for the first, third, and fourth instances of time according to the reference frequency of 1 MHz. MUX output signal 311C shows the dividing of the oscillator frequency of VCO 210 by a divider value of 10 for the third instance of time according to the reference frequency of 1 MHz and the dividing of the oscillator frequency of VCO 210 by a divider value of 11 for the first, second, and fourth instances of time according to the reference frequency of 1 MHz. MUX output signal 311D shows the dividing of the oscillator frequency of VCO 210 by a divider value of 10 for the fourth instance of time according to the reference frequency of 1 MHz and the dividing of the oscillator frequency of VCO 210 by a divider value of 11 for the first, second, and third instances of time according to the reference frequency of 1 MHz.

The circled information for each of the various instances is provided through modulator feedback signal 217 from digital delta-sigma modulator 213 to fractional-frequency-interval PFD 204. For example, the circled information for the first instance indicates to fractional-frequency-interval PFD 204 through modulator feedback signal 217 that none of the PFD units 304A, 304B, 304C, or 304D needs to receive a delayed feedback frequency $f_{216}$. The circled information for the second instance indicates to fractional-frequency-interval PFD 204 through modulator feedback signal 217 that three of the PFD units 304A, 304B, 304C, or 304D needs to receive the delayed feedback frequency $f_{216}$. The circled information for the third instance indicates to fractional-frequency-interval PFD 204 through modulator feedback signal 217 that two of the PFD units 304A, 304B, 304C, or 304D need to receive the delayed feedback frequency $f_{216}$ The circled information for the fourth instance indicates through modulator feedback signal 217 that one of the PFD units 304A, 304B, 304C, or 304D need to receive the delayed feedback frequency $f_{216}$. The circled information for the fifth instance indicates through modulator feedback signal 217 that none of the PFD units 304A, 304B, 304C, or 304D need to receive the delayed feedback frequency $f_{216}$.

Fractional-frequency-interval PFD 204 responds in accordance to the circled information received from digital delta-sigma modulator 213. For example, the high-level diagram of FIG. 4A, which illustrates the one instance of exemplary inputs to the PFD units in which one delayed feedback frequency $f_{216}$ is input to one of the PFD units, corresponds to the fourth instance of the output timing diagram 504. As a further example, the high-level diagram of FIG. 4B, which illustrates the one instance of exemplary inputs to the PFD units in which a delayed feedback frequency $f_{216}$ is input to three of the PFD units, corresponds to the second instance of the output timing diagram 504.

The present invention, in effect, decreases the interval between which the feedback frequency from the divider module of a PLL circuit modulates since it is being modulated between a fraction 1/X of a division interval instead of a whole integer interval (e.g., two whole integers). Since the frequency interval is smaller, the overall amount of phase noise introduced and error injected into the PLL circuit is also smaller.

Thus, the present invention decreases the overall amount of phase noise, errors, and spurious tones introduced or injected in a fractional-integer PLL circuit. The present invention provides a fractional-integer PLL that reduces or eliminates non-linear errors that tend to cause out-of-band modulator quantization noise to be folded into low frequencies. The present invention enables a fractional-integer PLL circuit to have a wider bandwidth and a higher, more desired corner frequency. The present invention additionally provides a fractional-integer PLL that is not limited to modulating between two integer values. The present invention overcomes the problems and disadvantages in accordance with the prior art.

While the invention has been particularly shown and described with reference to a preferred embodiment, it will be understood by those skilled in the art that various changes in form and detail may be made therein without departing from the spirit and scope of the invention.

what is claimed is:

1. A method of implementing a fractional-frequency-interval phase frequency detector having a plurality of phase frequency detector units for a phase locked loop circuit, comprising:
    inputting a reference input frequency as first inputs into the phase frequency detector units; and
    inputting and selectively delaying a feedback frequency of a feedback loop signal from a phase locked loop circuit as second inputs into the phase frequency detector units so that the second inputs are aligned for input according to the reference input frequency and an oscillator frequency is, in effect, responsive to the phase frequency detector units and allowed to be divided by a fractional-integer divider value.

2. The method according to claim 1, further comprising:
    summing, by a summer, outputs from the phase frequency detector units to provide an output of the fractional-frequency-interval phase frequency detector.

3. The method according to claim 1, wherein inputting and selectively delaying a feedback frequency of a feedback loop signal further comprises:
    determining, by a delta-sigma modulator, a divider value for each of the phase frequency detector units and a select number of the phase frequency detector units that are to receive a delayed feedback frequency; and
    inputting, by a multiplexer, the delayed feedback frequency into the select number of the phase frequency detector units.

4. The method according to claim 1, further comprising:
    coupling the plurality of phase frequency detector units to a number of fractional gain units.

5. The method according to claim 1, wherein inputting and selectively delaying a feedback frequency of a feedback loop signal further comprises:
    determining, by a delta-sigma modulator, a divider value for each of the plurality of phase frequency detector units and a select number of the plurality of phase frequency detector units that are to receive a delayed feedback frequency; and
    inputting, by a multiplexer, the delayed feedback frequency into the select number of the plurality of phase frequency detector units.

6. The method according to claim 1, further comprising:
    selecting, by a dynamic element matching system, which of the plurality of phase frequency detector units are to receive a delayed feedback frequency to dynamically match usage of the plurality of phase frequency detector units over a time period.

7. A fractional-frequency-interval phase frequency detector for a fractional-integer phase locked loop circuit, comprising:
    a plurality of phase frequency detector units;
    wherein a reference input frequency is input as first inputs into the phase frequency detector units;
    wherein a feedback frequency of a feedback loop signal from a phase locked loop circuit is input and selectively delayed as second inputs into the phase frequency detector units so that the second inputs are aligned for input according to the reference input frequency and an oscillator frequency is, in effect, responsive to the phase frequency detector units and allowed to be divided by a fractional-integer divider value.

8. The fractional-frequency-interval phase frequency detector according to claim 7, further comprising:
    a summer for summing outputs from the phase frequency detector units to provide an output of the fractional-frequency-interval phase frequency detector.

9. The fractional-frequency-interval phase frequency detector according to claim 7,
    wherein a delta-sigma modulator determines and selects a divider value for each of the phase frequency detector units and a select number of the phase frequency detector units that are to receive a delayed feedback frequency; and
    further comprises a multiplexer that inputs the delayed feedback frequency into the select number of the phase frequency detector units.

10. The fractional-frequency-interval phase frequency detector according to claim 7, further comprises:
    a number of fractional gain units coupled to the plurality of phase frequency detector units.

11. The fractional-frequency-interval phase frequency detector according to claim 7, further comprises:
    a dynamic element matching system for selecting which of the plurality of the phase frequency detector units are to receive a delayed feedback frequency to dynamically match usage of the plurality of phase frequency detector units over a time period.

12. A phase-locked loop circuit, comprising:
    a fractional-frequency-interval phase frequency detector having a plurality of phase frequency detector units;
    a charge pump coupled to the fractional-frequency-interval phase frequency detector;
    an oscillator coupled to the charge pump wherein the oscillator is responsive to the fractional-frequency-interval phase frequency detector; and
    a divider that is responsive to the oscillator and provides divider values for dividing an oscillator frequency by the divider values to provide a feedback frequency of a feedback loop signal of the phase-locked loop circuit; and
    wherein a reference input frequency is input as first inputs into the phase frequency detector units; and
    wherein the feedback frequency is input and selectively delayed as second inputs into the phase frequency detector units so that the second inputs are aligned for input according to the reference input frequency and an oscillator frequency is, in effect, responsive to the phase frequency detector units and allowed to be divided by a fractional-integer divider value.

13. The phase-locked loop circuit according to claim 12, further comprises:
    a delta-sigma modulator for receiving a desired divide ratio wherein the delta-sigma modulator is coupled to the divider for receiving and clocking the feedback frequency and for providing a modulated output to the divider for modulating between dividing by the divider values and further providing a modulator feedback signal to the fractional-frequency-interval phase frequency detector wherein the delta-sigma modulator determines a divider value for each of the plurality of phase frequency detector units and a select number among the plurality of phase frequency detector units that are to receive a delayed feedback frequency.

14. The phase-locked loop circuit according to claim 12, wherein the fractional-frequency-interval phase frequency detector further comprises:
   a multiplexer that inputs a delayed feedback frequency into a select number of the plurality of phase frequency detector units.

15. The phase-locked loop circuit according to claim 12, wherein the fractional-frequency-interval phase frequency detector further comprises:
   a dynamic element matching system for selecting which of the plurality of the phase frequency detector units are to receive a delayed feedback frequency to dynamically match usage of the plurality of phase frequency detector units over a time period.

16. The phase-locked loop circuit according to claim 12, wherein the fractional-frequency-interval phase frequency detector further comprises:
   a number of fractional gain units coupled to the plurality of phase frequency detector units.

17. The phase-locked loop circuit according to claim 12, wherein the fractional-frequency-interval phase frequency detector further comprises:
   a summer for summing outputs from the phase frequency detector units to provide an output of the fractional-frequency-interval phase frequency detector.

18. The phase-locked loop circuit according to claim 12, wherein the divider values are two integer values.

19. The phase-locked loop circuit according to claim 12, wherein the divider values are three integer values.

* * * * *